United States Patent
Kubo et al.

(10) Patent No.: US 11,349,497 B2
(45) Date of Patent: May 31, 2022

(54) TRANSMITTER, RECEIVER, COMMUNICATION SYSTEM, METHOD FOR CHANGING CODE RATE, CONTROL CIRCUIT AND NON-TRANSITORY STORAGE MEDIUM

(71) Applicant: Mitsubishi Electric Corporation, Tokyo (JP)

(72) Inventors: Kazuo Kubo, Tokyo (JP); Hideo Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/098,648

(22) Filed: Nov. 16, 2020

(65) Prior Publication Data
US 2021/0067174 A1  Mar. 4, 2021

Related U.S. Application Data

(63) Continuation of application No. PCT/JP2018/020540, filed on May 29, 2018.

(51) Int. Cl.
*H03M 13/00* (2006.01)
*H03M 13/11* (2006.01)
(Continued)

(52) U.S. Cl.
CPC ..... *H03M 13/1105* (2013.01); *H03M 13/616* (2013.01); *H04B 1/04* (2013.01); *H04B 1/16* (2013.01)

(58) Field of Classification Search
CPC .... H03M 13/05; H03M 13/35; H03M 13/116; H03M 13/118; H03M 13/616;
(Continued)

(56) References Cited

U.S. PATENT DOCUMENTS 9,577,675 B1 *  2/2017  Varnica ................ H03M 13/611
2004/0098659 A1 *  5/2004  Bjerke ............... H03M 13/6393
714/776
(Continued)

FOREIGN PATENT DOCUMENTS

JP  4598085 B2  12/2010
JP  5301402 B2   9/2013
(Continued)

OTHER PUBLICATIONS

Extended European Search Report for European Application No. 18921057.8, dated Mar. 25, 2021.
(Continued)

*Primary Examiner* — Albert Decady
*Assistant Examiner* — Enamul M Kabir
(74) *Attorney, Agent, or Firm* — Birch, Stewart, Kolasch & Birch, LLP

(57) ABSTRACT

A transmitter according to the disclosure includes: an encoding unit that generates a code word by performing coding with a low-density parity-check code using a check matrix, the encoding unit being capable of switching the check matrix for use in generating the code word, between a first check matrix with a first code rate and a second check matrix with a second code rate smaller than the first code rate, the first check matrix containing a plurality of cyclic permutation matrices, the encoding unit generating the second check matrix by masking the cyclic permutation matrix at a predetermined position in the first check matrix and adding a row with a column weight equal to or less than a threshold; and a transmission unit that transmits the code word.

11 Claims, 7 Drawing Sheets

(51) Int. Cl.
*H04B 1/04* (2006.01)
*H04B 1/16* (2006.01)

(58) Field of Classification Search
CPC ......... H03M 13/1105; H03M 13/1177; H03M 13/1185; H03M 13/6516; H03M 13/6508; H04B 1/04; H04B 1/16
USPC ........................................................ 714/776
See application file for complete search history.

(56) References Cited

U.S. PATENT DOCUMENTS

| | | | | |
|---|---|---|---|---|
| 2007/0011566 | A1* | 1/2007 | Gray | H03M 13/1137 714/758 |
| 2010/0058140 | A1* | 3/2010 | Matsumoto | H03M 13/6508 714/752 |
| 2010/0229066 | A1* | 9/2010 | Matsumoto | H03M 13/116 714/752 |
| 2011/0307756 | A1* | 12/2011 | Nguyen | H03M 13/6393 714/752 |
| 2012/0210189 | A1* | 8/2012 | Sugihara | H03M 13/1182 714/752 |
| 2013/0139038 | A1* | 5/2013 | Yosoku | H03M 13/1188 714/780 |
| 2015/0155884 | A1* | 6/2015 | El-Khamy | H03M 13/1154 714/752 |
| 2015/0365105 | A1* | 12/2015 | Sugihara | H03M 13/616 714/776 |
| 2018/0034476 | A1* | 2/2018 | Kayser | H03M 13/116 |
| 2019/0260390 | A1* | 8/2019 | Shutkin | H03M 13/6561 |
| 2020/0351017 | A1* | 11/2020 | Zhang | H04L 1/0041 |

FOREIGN PATENT DOCUMENTS

| | | |
|---|---|---|
| JP | 5875713 B2 | 3/2016 |
| WO | WO 2007/080827 A1 | 7/2007 |
| WO | WO 2014/122772 A1 | 8/2014 |
| WO | WO 2018/082290 A1 | 5/2018 |

OTHER PUBLICATIONS

Niu et al., "Multi-Rate LDPC Decoder Implementation for China Digital Television Terrestrial Broadcasting Standard", Proc. 5th International Conference on Communications, Circuits and Systems, IEEE. Jul. 2007, pp. 24-28.
International Search Report, issued in PCT/JP2018/020540, dated Aug. 21, 2018.
Japanese Notice of Rejection, issued in the corresponding App. No. 2020-522429, dated Jul. 28, 2020.
Kudekar et al., "Threshold Saturation via Spatial Coupling: Why Convolutional LDPC Ensembles Perform So Well over the BEC", IEEE Trans. Inform. Theory, Feb. 2011, vol. 57, No. 2, pp. 803-834.

* cited by examiner

TRANSMITTER, RECEIVER, COMMUNICATION SYSTEM, METHOD FOR CHANGING CODE RATE, CONTROL CIRCUIT AND NON-TRANSITORY STORAGE MEDIUM

CROSS-REFERENCE TO RELATED APPLICATION

This application is a continuation application of International Application PCT/JP2018/020540, filed on May 29, 2018, and designating the U.S., the entire contents of which are incorporated herein by reference.

BACKGROUND OF THE INVENTION

1. Field of the Invention

The disclosure relates to a transmitter, a receiver, a communication system, and a method for changing a code rate, in which error correction is performed by use of a low-density parity-check (LDPC) code.

2. Description of the Related Art

In recent optical communication systems and wireless communication systems, error-correcting codes are applied to data for the purpose of increasing transmission capacity and transmission distance. Error-correcting codes are used to correct errors in data to be used in wired communication systems, wireless communication systems, and storage devices. An error correction coding process, which adds a redundant bit to data to be transmitted on the transmitting side, can correct the error in received data. The number of correctable error bits differs depending on the code rate of an error-correcting code and a decoding scheme.

Examples of error-correcting codes include Hamming codes, Bose-Chaudhuri-Hocquenghem (BCH) codes, and Reed-Solomon (RS) codes. In an error-correcting code, a piece of transmission data (including overhead and the like included in a frame) is referred to as an information bit, and a redundant bit added to the information bit is referred to as a parity bit. In addition, a bit string, which has an information bit and a parity bit are combined together, is referred to as a code word. In an error-correcting code called a block code, parity bits are calculated from information bits in units of a preset number of bits. That is, the number of information bits and the number of parity bits in a single code word are predetermined. The number of information bits is referred to as information bit length, and the number of parity bits is referred to as parity bit length. In addition, the number of bits in a code word is referred to as code length.

In optical communication systems and wireless communication systems, there is a significant demand for an increase in transmission capacity and transmission distance, and strong error-correcting codes are applied and proposed from day to day. In recent years, LDPC codes have been widely used as error-correcting codes. The LDPC code is a block code defined by a sparse parity check matrix (hereinafter, referred to as "check matrix") with few nonzero elements. The description hereinbelow is based on the assumption that each matrix element of a check matrix to be described below is 0 or 1. Furthermore, the number of the elements "1" included in a column of the check matrix is referred to as a column weight, and the number of the elements "1" included in a row of the check matrix is referred to as a row weight. In addition, each column of the check matrix corresponds to each bit included a code word. That is, the number of columns in the check matrix corresponds to a code length. Moreover, the number of rows of the check matrix is equal to a parity bit length when the check matrix is full rank.

Japanese Patent No. 5875713 discloses a spatially-coupled forward error correction (FEC) configuration as a method for improving the error correction capability of LDPC codes. In addition, according to a method disclosed in Japanese Patent No. 5875713, rows of a submatrix defined by some columns of a check matrix are rearranged to thereby provide the matrix structure with a high error correction capability. In addition, the number of parity bits to be transmitted and received is reduced to change a code rate. That is, Japanese Patent No. 5875713 describes a method for improving error correction capability with high efficiency as well as changing a code rate while maintaining the capability of spatially-coupled LDPC codes.

SUMMARY OF THE INVENTION

However, the method for improving the correction capability described in Japanese Patent No. 5875713 uses a technique for thinning out parity bits, which is called puncturing, in changing the code rate of a code word from a low code rate to a high code rate. Such a method, which employs the puncturing, unavoidably deteriorates the capability to a certain degree. In addition, it is necessary to perform coding and decoding with a throughput necessary for processing a code word before thinning out parity bits. As a result, for example, operating frequency increases or the number of times iterative decoding is performed decreases and eventually, power consumption increases and error correction capability deteriorates.

The disclosure has been made in view of the above, and an object of the disclosure is to obtain a transmitter that can prevent an increase in power consumption and a deterioration in error correction capability.

To solve the above problems and the object, the disclosure provides a transmitter comprising: an encoding unit to generate a code word by performing coding with a low-density parity-check code using a check matrix, the encoding unit being capable of switching the check matrix for use in generating the code word, between a first check matrix with a first code rate and a second check matrix with a second code rate smaller than the first code rate, the first check matrix containing a plurality of cyclic permutation matrices, the encoding unit generating the second check matrix by masking the cyclic permutation matrix at a predetermined position in the first check matrix and adding a row with a column weight equal to or less than a threshold; and a transmission unit to transmit the code word.

DETAILED DESCRIPTION OF THE PREFERRED EMBODIMENTS

Hereinafter, a transmitter, a receiver, a communication system, and a method for changing a code rate according to an embodiment of the disclosure will be described in detail with reference to the drawings. Note that the disclosure is not limited to the embodiment.

Embodiment

Figure 1:
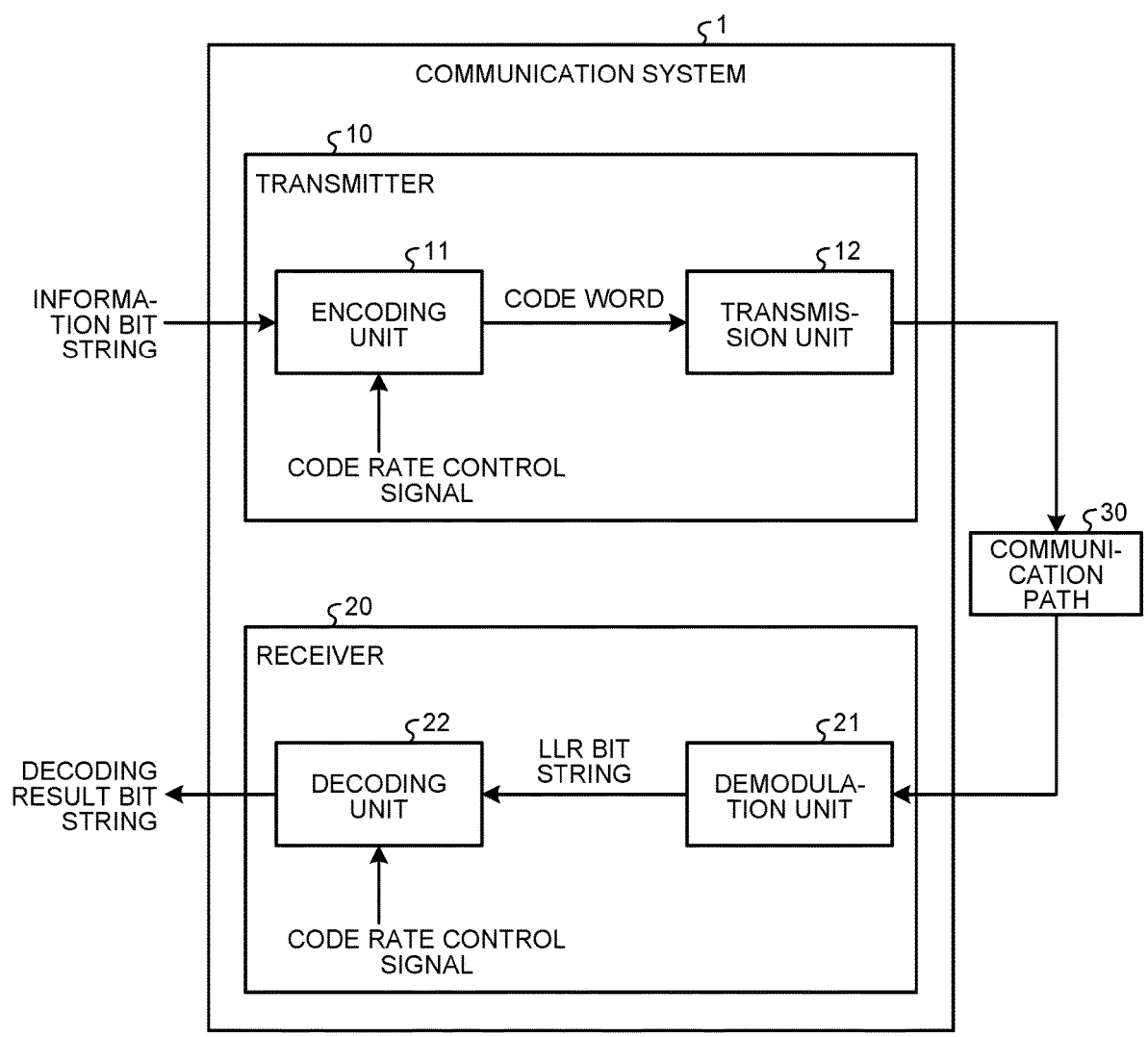
FIG. 1 is a diagram illustrating functional blocks of a communication system according to an embodiment.

FIG. 1 is a diagram illustrating functional blocks of a communication system according to the embodiment. A communication system 1 includes a transmitter 10 and a receiver 20. The transmitter 10 and the receiver 20 are connected to each other via a communication path 30. The transmitter 10 includes an encoding unit 11 and a transmission unit 12. The encoding unit 11 performs LDPC coding on an input information bit string, at a code rate based on an instruction of a code rate control signal, and outputs a code word to the transmission unit 12. Information bit strings, which are data to be transmitted, may be generated by a generation unit (not illustrated) located outside the transmitter 10 or may be generated in the transmitter 10. The code rate control signal is generated by a code rate determination unit (not illustrated). The code rate determination unit determines a code rate in consideration of requirements for protection of data transmission and the state of a channel for data transmission, and transmits, to the encoding unit 11, a code rate control signal indicating the code rate. The transmission unit 12 converts the code word into a transmission signal such as radio waves, light, or an electric signal, and transmits the transmission signal to the receiver 20 via the communication path 30.

The receiver 20 includes a demodulation unit 21 and a decoding unit 22. The demodulation unit 21 calculates a log-likelihood ratio (LLR) bit string by using the signal received from the transmitter 10, and outputs the calculated LLR bit string to the decoding unit 22. The LLR is a value calculated for each bit. The LLR indicates whether each bit is 0 or 1, and also indicates the likelihood of each bit. For example, the LLR of a bit, which is a positive value with a large absolute value, indicates a high possibility that this bit is 0. The LLR of a bit, which is a negative value with a large absolute value, indicates a high possibility that this bit 1. Furthermore, the LLR, which is 0, indicates that this bit is 0 or 1 or there is no information at all. Note that, in contrast, in some case, an LLR is defined as indicating a high possibility that a bit is 0 if the LLR of the bit is a negative value with a large absolute value, and indicating a high possibility that a bit is 1 if the LLR of the bit is a positive value with a large absolute value. Using the LLR bit string, the decoding unit 22 decodes the LDPC code at the code rate based on the instruction of the code rate control signal. The decoding unit 22 then outputs a decoding result bit string.

Figure 2:
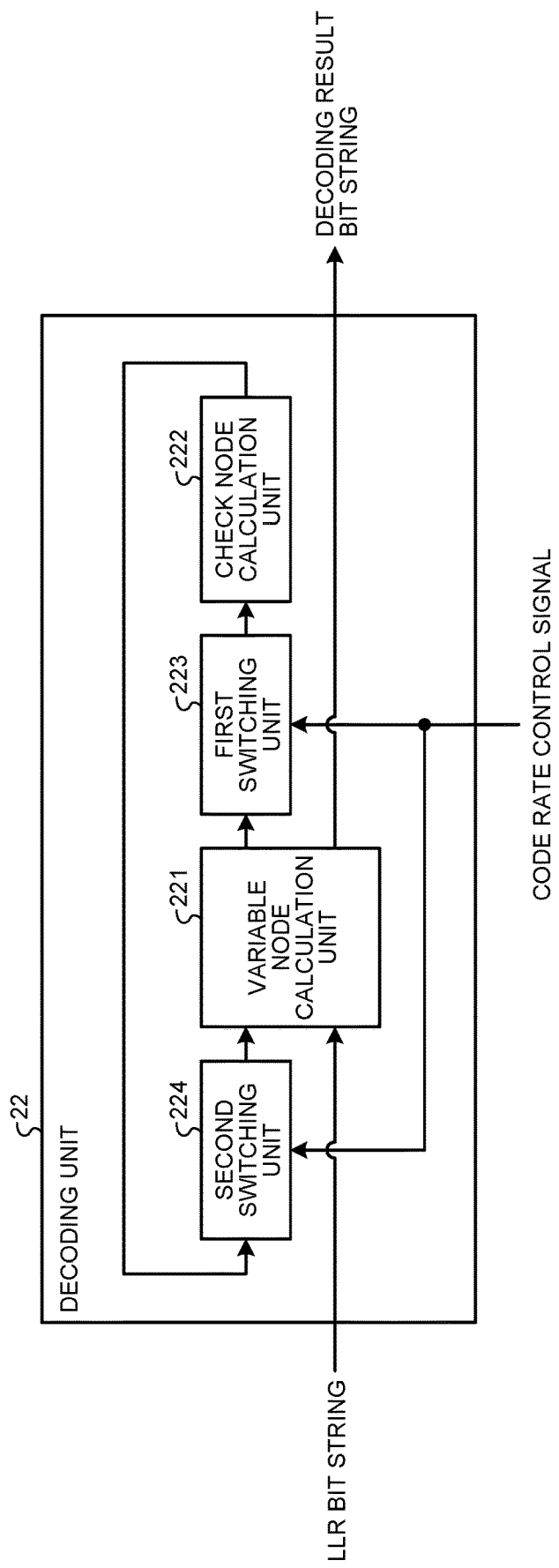
FIG. 2 is a diagram illustrating functional blocks of a decoding unit according to the embodiment.

FIG. 2 is a diagram illustrating functional blocks of the decoding unit 22 according to the embodiment. The decoding unit 22 includes a variable node calculation unit 221, a check node calculation unit 222, a first switching unit 223, and a second switching unit 224.

An LLR bit string is input to the variable node calculation unit 221. The variable node calculation unit 221 performs calculation based on belief propagation in a column direction by using a check matrix and the LLR bit string for decoding, and outputs a calculation result to the first switching unit 223. The check node calculation unit 222 performs calculation based on belief propagation in a row direction by using the check matrix and the LLR bit string, and outputs a calculation result to the second switching unit 224. When the variable node calculation unit 221 completes performing an iterative decoding process a certain number of times, the variable node calculation unit 221 outputs a decoding result bit string to the outside. The first switching unit 223 switches the connection relationship between the column calculated by the variable node calculation unit 221 and the row calculated by the check node calculation unit 222, in accordance with the code rate indicated by the code rate control signal. A result of calculation by the variable node calculation unit 221, which is output from the first switching unit 223, is input to the check node calculation unit 222. The second switching unit 224 switches the connection relationship between the row calculated by the check node calculation unit 222 and the column calculated by the variable node calculation unit 221, in accordance with the code rate indicated by the code rate control signal. A result of calculation by the check node calculation unit 222, which is output from the second switching unit 224, is input to the variable node calculation unit 221. Connection relationship switching operation to be performed by the first switching unit 223 and the second switching unit 224 will be described below in detail.

The encoding unit 11, the transmission unit 12, the demodulation unit 21, and the decoding unit 22 according to the embodiment are implemented by processing circuitry as electronic circuitry that performs each process.

The present processing circuitry may be dedicated hardware or a control circuit including a memory and a central processing unit (CPU) that executes a program stored in the memory. Here, the memory corresponds to, for example, a nonvolatile or volatile semiconductor memory, such as a random access memory (RAM), a read only memory (ROM), or a flash memory, a magnetic disk, or an optical disk. In the case where the present processing circuitry is a control circuit including a CPU, the control circuit is exemplified by a control circuit 300 with a configuration illustrated in FIG. 3.

Figure 3:
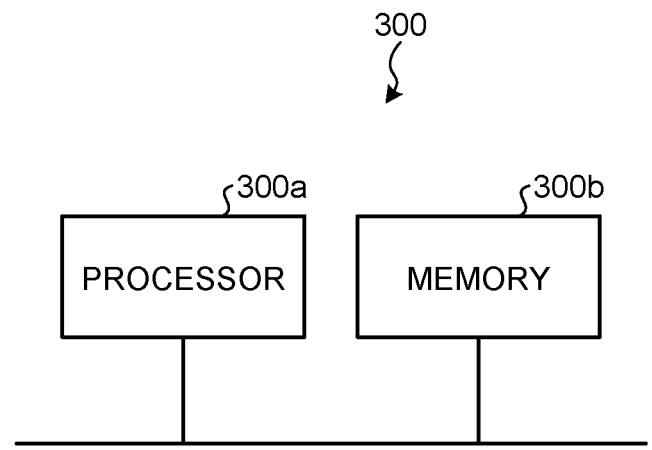
FIG. 3 is a diagram illustrating a control circuit.

As illustrated in FIG. 3, the control circuit 300 includes a processor 300a, which is a CPU, and a memory 300b. In the case where the above-described functional units are implemented by the control circuit 300 illustrated in FIG. 3, these units are implemented by the processor 300a reading and executing a program corresponding to each process, stored in the memory 300b. In addition, the memory 300b is also used as a temporary memory in each process to be performed by the processor 300a.

A method for changing a code rate in the encoding unit 11 and the decoding unit 22 will be described. If the communication system 1 is configured such that encoding and decoding are performed using a plurality of check matrices so as to support a plurality of code rates, circuit size increases. Therefore, it is required that a code rate be efficiently changeable so as to reduce the circuit size of the communication system 1. First, the data structure of the check matrix of the error-correcting code used in the encoding unit 11 and the decoding unit 22 will be described.

Figure 4:
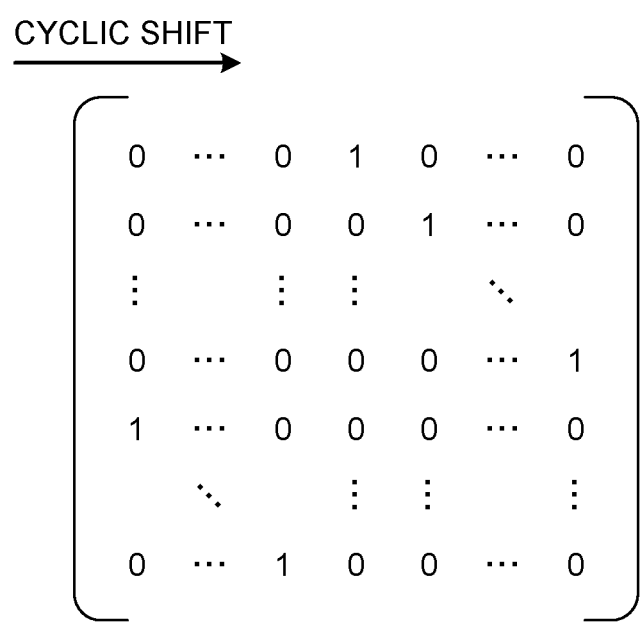
FIG. 4 is a diagram illustrating a cyclic permutation matrix.

FIG. 4 is a diagram illustrating a cyclic permutation matrix. A cyclic permutation matrix is a matrix obtained as a result of cyclically shifting an identity matrix. Cyclic shift refers to the following operation: in a general case where a column is shifted rightward, the rightward shifted column is then inserted to the leftmost column of a matrix without being forced out of the matrix as a result of the rightward shifting. The number of columns to be shifted is referred to as a shift amount. Where the check matrix of an LDPC code is represented as a partitioned matrix containing cyclic permutation matrices as sub-check matrices, this LDPC code is referred to as a quasi-cyclic (QC) LDPC code. The QC-LDPC code is often used in practice because construction of a check matrix and circuit implementation are relatively easy.

Figure 5:
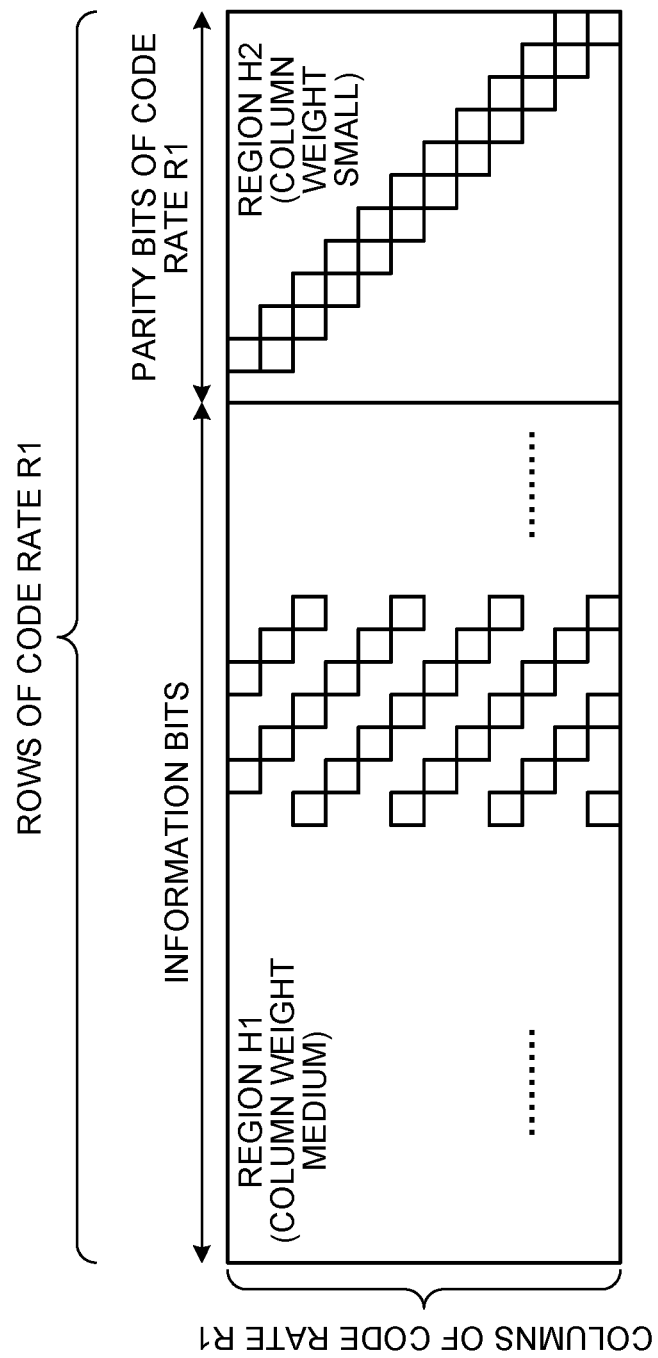
FIG. 5 is a diagram illustrating an example of a check matrix of an LDPC code with a code rate R1 according to the embodiment.

FIG. 5 is a diagram illustrating an example of a check matrix of an LDPC code with a code rate R1 according to the embodiment. In the present embodiment, the check matrix illustrated in FIG. 5 is referred to as a first check matrix. The first check matrix is a check matrix constructed as a partitioned matrix containing cyclic permutation matrices as sub-check matrices. The code rate R1 is also referred to as a first code rate. A code rate is the ratio of the numbers of columns, that is, a value to be obtained by the following formula: (the number of columns in a region H1)÷(the number of columns in the region H1+the number of columns in a region H2). Furthermore, the number of rows at the code rate R1 is equal to the number of parity columns at the code rate R1. Cyclic permutation matrices are illustrated as small quadrangles obliquely arranged in FIG. 5. The cyclic permutation matrices have different shift amounts. However, some of the cyclic permutation matrices may have the same shift amount. The first check matrix has the region H1 and the region H2. The region H1 is a region including information bits. The region H2 is a region including parity bits of the code rate R1. The first check matrix is an exemplary matrix in which column weights in the region H1 are equal to or less than a threshold so that a high error correction capability is achieved with excellent waterfall characteristics. In addition, column weights in the region H2 of the first check matrix are reduced to achieve a reduction of the circuit size. A column weight being equal to or less than the threshold means that the column weight is 4, 3 or a mixture of 4 and 3. A small column weight means that the column weight is approximately 2. The waterfall characteristics refer to a sharp decrease in a bit error rate after decoding at a certain input bit error rate.

Figure 6:
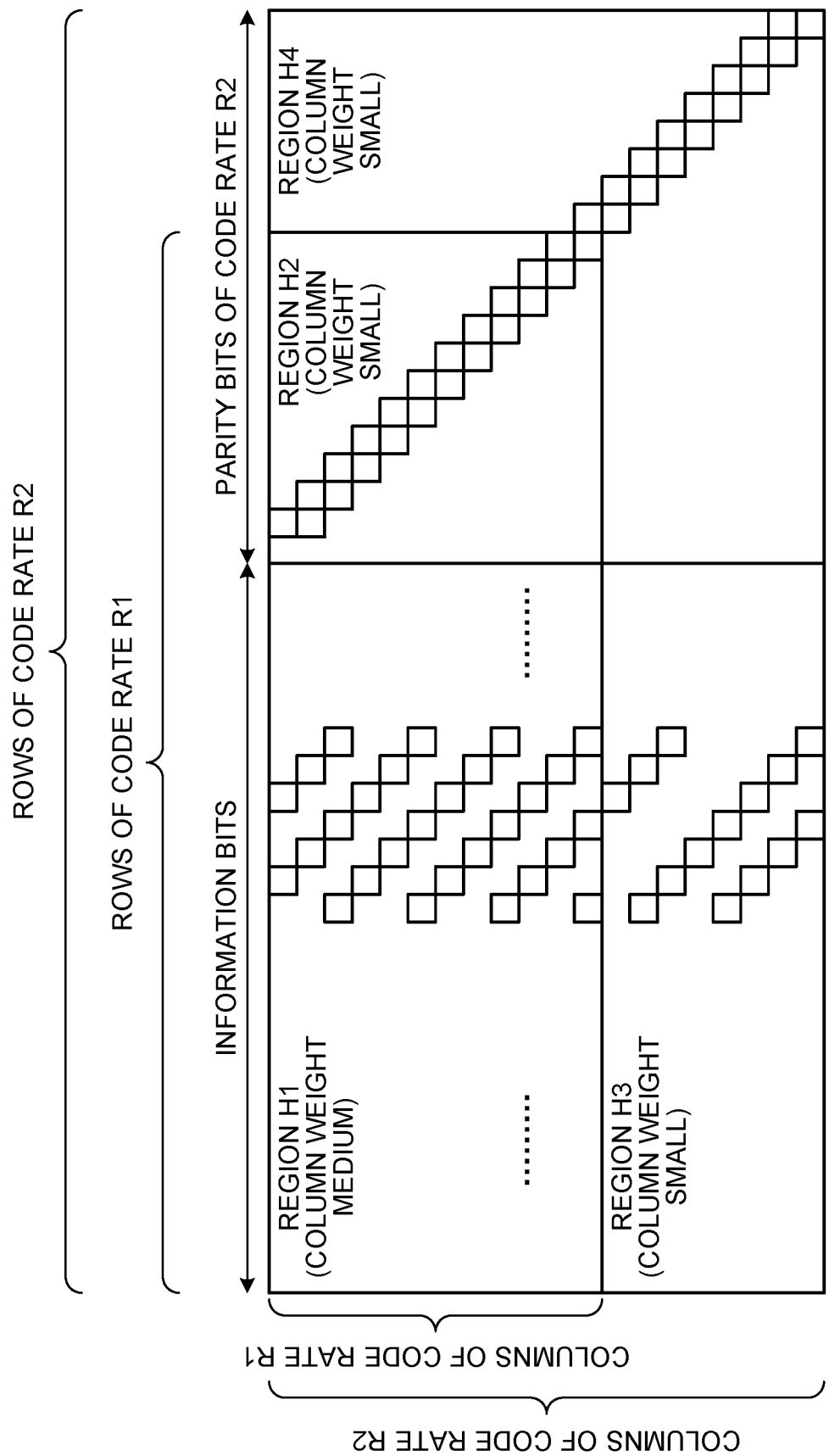
FIG. 6 is a diagram illustrating an example of a check matrix of an LDPC code with a code rate R2 according to the embodiment.

FIG. 6 is a diagram illustrating an example of a check matrix of an LDPC code with a code rate R2 according to the embodiment. In the present embodiment, the check matrix illustrated in FIG. 6 is referred to as a second check matrix. The second check matrix includes regions H3 and H4 in addition to the regions H1 and H2. The region H3 is a region including information bits. The region H4 is a region of parity bits added so as to satisfy the code rate R2. A region obtained by combination of the regions H2 and H4 is a region including parity bits of the code rate R2. The code rate R2 is also referred to as a second code rate. The value of the second code rate is smaller than that of the first code rate. To reduce the code rate R1 on the basis of a code rate control signal for improving error correction capability, a check matrix of the code rate R2 like the second check matrix is constructed. Such a check matrix of the code rate R2 uses the check matrix common to the check matrix of the code rate R1 as the check matrix of the code rate R2 includes a check matrix of the code rate R1 and the additional regions H3 and H4 with small column weights. Using such a common check matrix can reduce the circuit size.

Figure 7:
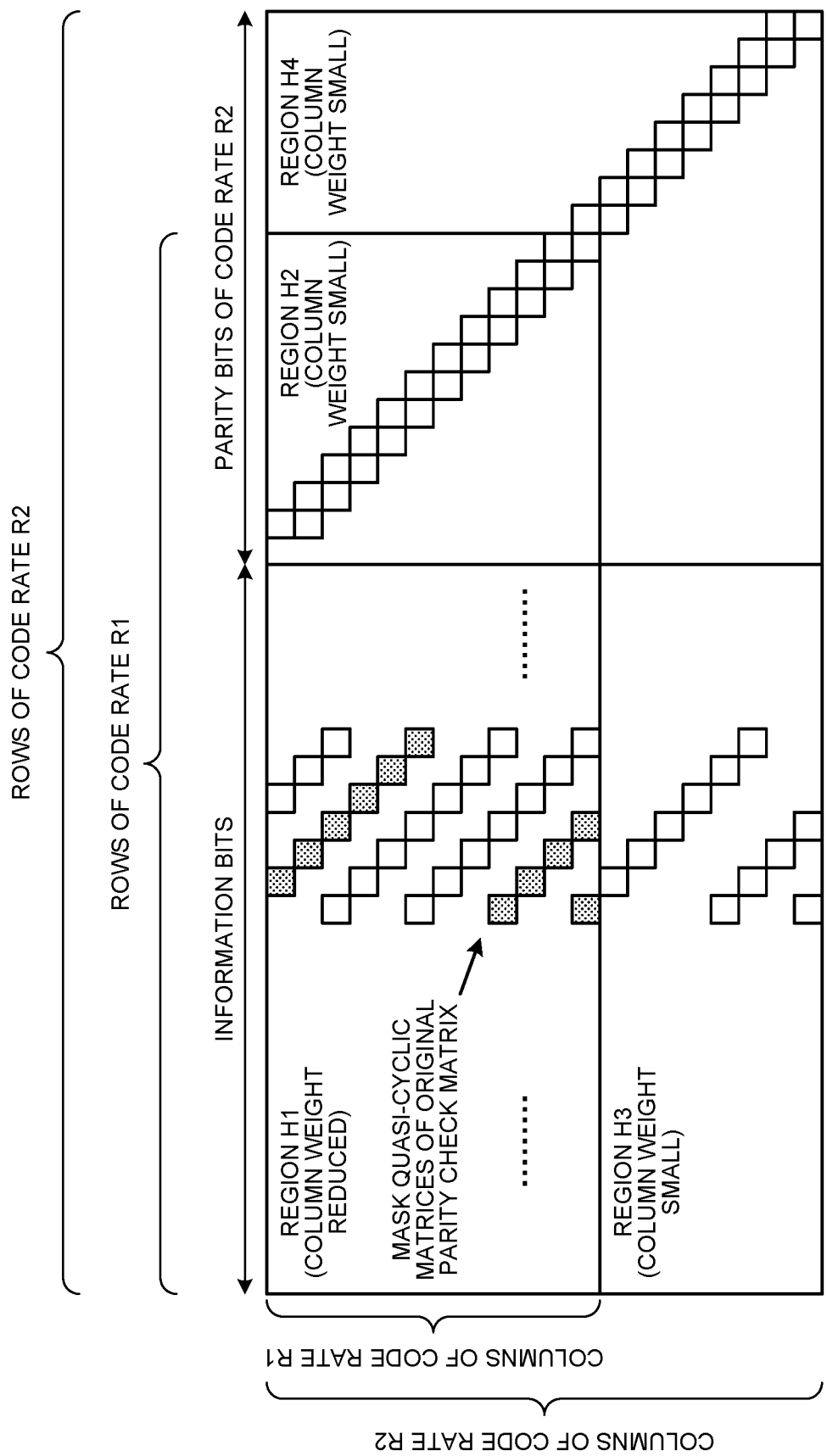
FIG. 7 is a diagram illustrating another example of the check matrix of the LDPC code with the code rate R2 according to the embodiment.

FIG. 7 is a diagram illustrating another example of the check matrix of the LDPC code with the code rate R2 according to the embodiment. In the present embodiment, the check matrix illustrated in FIG. 7 is referred to as another example of the second check matrix. The second check matrix of the other example has the same configuration as the second check matrix except for the region H1. In the other example of the second check matrix, some predetermined quasi-cyclic matrices are masked in the region H1. Here, "masking" refers to inverting elements "1" included in the matrix into "0". FIG. 7 illustrates the masked quasi-cyclic matrices in gray. In the other example, the second check matrix is constructed such that the column weights of columns of information bits in the region H3 and the masked region H1 are maintained at or below a threshold. Where a submatrix defined by some columns of the check matrix has rows rearranged, the arrangement of the quasi-cyclic matrices has regularity. In view of this, some quasi-cyclic matrices to be masked have regularity in the region H1 of the other example of the second check matrix. In addition, the region H3 has such a regularity that quasi-cyclic matrices are arranged with column weights maintained at or below the threshold. Thus, each of weights of some columns in the first check matrix is equal to a weight of a corresponding column in the second check matrix. As a result, it is possible to switch between the first check matrix and the second check matrix. Accordingly, it is possible to achieve, with high performance, a method that enables a code rate to be efficiently and easily changed.

Furthermore, if the column weights in the region H3 of the second check matrix are too small, error floor characteristics deteriorate. Meanwhile, if the column weights in the region H3 are equal to or greater than a uniform row weight, column weights in a region obtained as a result of adding the region H3 to the region H1 increase, which deteriorates the waterfall characteristics. Error floor characteristics refer to a slowdown in decrease in the bit error rate after decoding with respect to an improvement of a signal-to-noise ratio (SNR). Deterioration of error floor characteristics refers to a bit error rate being high even when the SNR is high. Deterioration of waterfall characteristics means that the value of an input bit error rate decreases when the bit error rate after decoding sharply decreases. In the other example of the second check matrix, some predetermined quasi-cyclic matrices are masked, thereby preventing a decrease in the column weights in the region H3 and also preventing an increase in the column weights in the region obtained as a result of adding the region H3 to the region H1. Thus, it is possible to prevent deterioration of the error floor characteristics and the waterfall characteristics.

Figure 8:
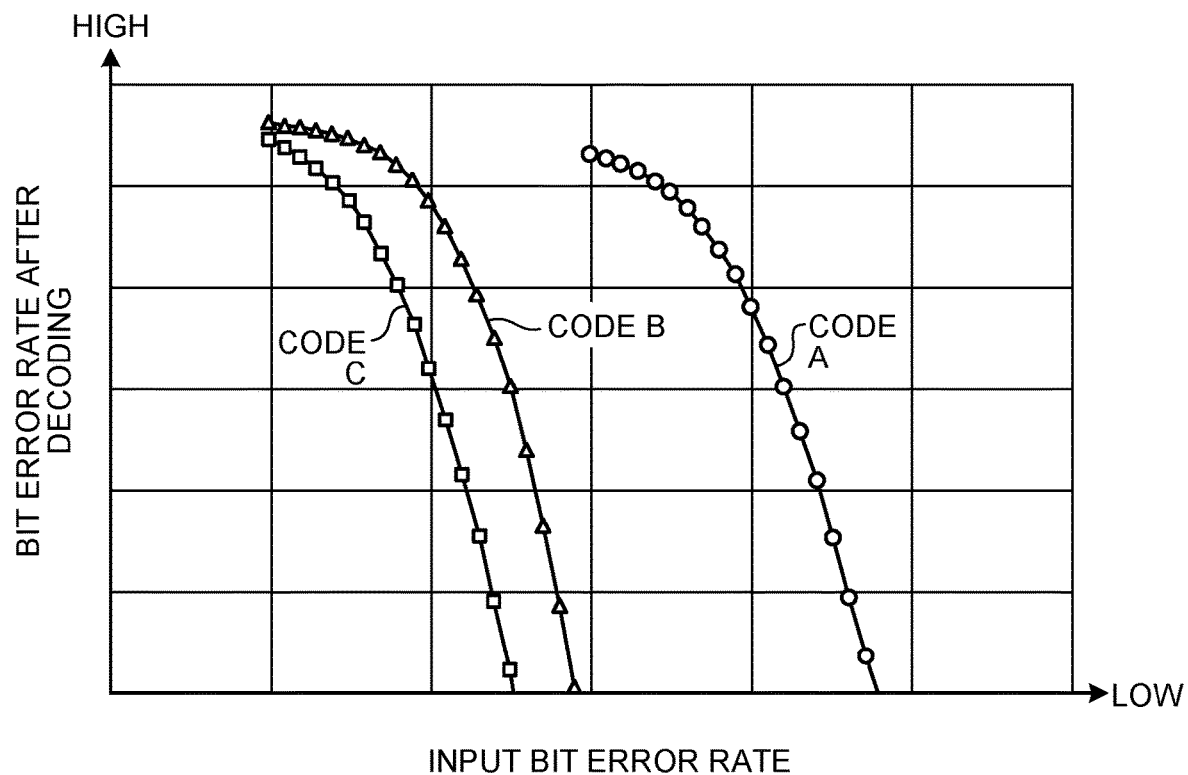
FIG. 8 is a diagram illustrating characteristics of error correction capability of an LDPC code by check matrix according to the embodiment.

FIG. 8 is a diagram illustrating characteristics of error correction capability of an LDPC code by check matrix according to the embodiment. FIG. 8 is a diagram in which the input bit error rate is on the horizontal axis and the bit error rate after decoding is on the vertical axis. In FIG. 8, the error performance characteristic of the first check matrix is represented as code A, the error performance characteristic of the second check matrix is represented as code B, and the error performance characteristic of the second check matrix in the another example is represented as code C. As illustrated in FIG. 8, the code C has an error correction capability superior to the code B in waterfall characteristics. Furthermore, since the code rate of the code C is better than that of the code A, the code C has a better error correction capability than the code A.

Figure 9:
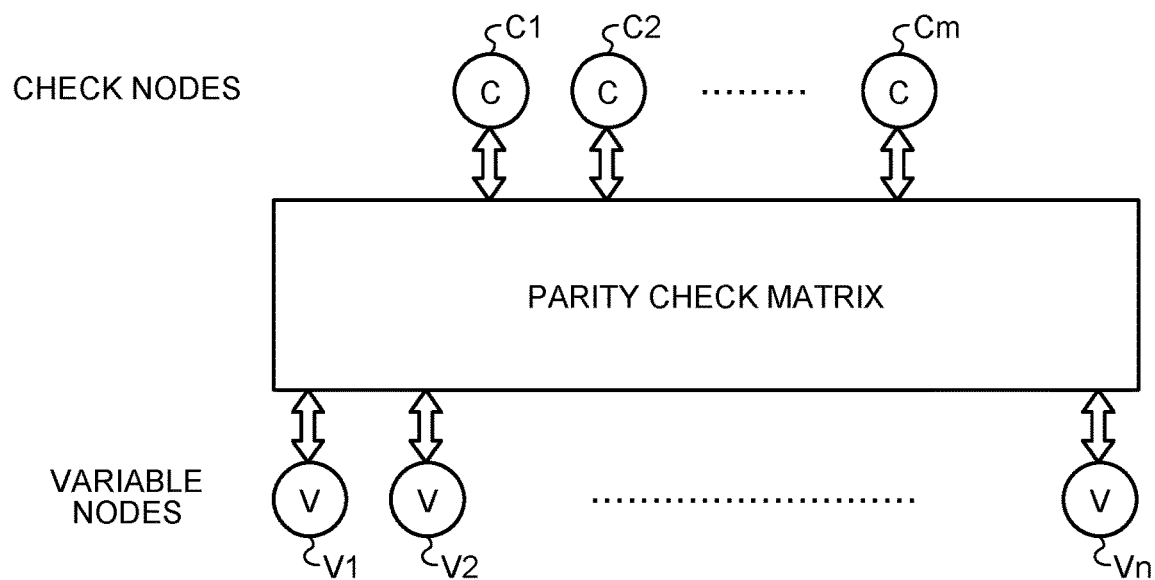
FIG. 9 is a diagram illustrating a Tanner graph formed with variable nodes and check nodes according to the present embodiment.

FIG. 9 is a diagram illustrating a Tanner graph formed with variable nodes and check nodes according to the present embodiment. Check nodes C1 to Cm correspond to the respective rows of a check matrix, and variable nodes V1 to Vn correspond to the respective columns of the check matrix. Note that the variable nodes and the check nodes are connected to each other in accordance with a check matrix to be used, but detailed connection relationships are omitted. In accordance with an instruction of a code rate control signal, the first switching unit 223 switches the connection relationship between the column calculated by the variable node calculation unit 221 and the row calculated by the check node calculation unit 222 such that the switched connection relationship becomes a connection relationship of either the check matrix with the code rate R1 or the check matrix with the code rate R2. Furthermore, In accordance with the instruction of the code rate control signal, the second switching unit 224 switches the connection relationship between the row calculated by the check node calculation unit 222 and the column calculated by the variable node calculation unit 221 such that the switched connection relationship becomes a connection relationship of either the check matrix with the code rate R1 or the check matrix with the code rate R2. In other words, the first switching unit 223 switches the connection relationship between the check nodes and the variable nodes in accordance with the code rate control signal such that a Tanner graph corresponding to the check matrix is formed. The second switching unit 224 switches the connection relationship between the variable nodes and the check nodes according to the code rate control signal such that a Tanner graph corresponding to the check matrix is formed.

As described above, in the present embodiment, the transmitter 10 holds the first check matrix, which is a check matrix with a large code rate. In addition, the transmitter 10 holds the second check matrix of the other example, which is constructed such that some quasi-cyclic matrices are masked and column weights of a check matrix with a small code rate are equal to or less than a threshold. The transmitter 10 can switch between the first check matrix and the second check matrix in accordance with a code rate control signal. Accordingly, it is possible to achieve an LDPC code that is excellent in waterfall characteristics and has a changeable code rate. Furthermore, the transmitter 10 is configured to use a check matrix common to the first check matrix and the second check matrix in the other example and switch the connection relationship between the variable nodes and the check nodes. Thus, the circuit size can be reduced to thereby prevent an increase in power consumption. Furthermore, a part of the region H1 of the first check matrix includes columns each having a column weight equal to a total column weight of a column in the second check matrix in the other example, the total column weight being obtained as a result of adding a column weight of a column in the region H3 to a column weight of a column in the region H1. Therefore, a check node output of the masked part can be switched to an added check node output. Thus, the variable node operation can be efficiently shared in a decoding circuit.

In the present embodiment, an example has been described in which the column weights of the columns in the region H1 and the region obtained as a result of adding the region H1 and the region H3 are all equal to or less than the threshold. However, some of the column weights of the columns in the region H1 and the region obtained as a result of adding the region H1 and the region H3 may be greater than the threshold. If some of the column weights are greater than the threshold, the effect of improving the waterfall characteristics may be obtained in some cases When the column weights are increased, a column weight may be added to a part of the region H3. Furthermore, in the present embodiment, an example has been described in which the column weights of the columns in the region H2 or the region H4 are all small. However, the column weights of the columns in the region H2 or the region H4 may be large. The effect of improving the error floor characteristics may be obtained also in this case. When the column weights of the columns in the region H2 or the region H4 are large, if column weights added to the region H4 of the same matrix as the region H1 are equal to or less than a masked part, a variable node output of the masked part can be switched to an added variable node output and thus, the check node operation can be efficiently shared in a decoding circuit. Note that described in the present embodiment is a method for changing a code rate of a quasi-cyclic LDPC code, the check matrix of which is represented as a partitioned matrix containing cyclic permutation matrices as sub-check matrices. However, the same effect can be achieved also in the case of an LDPC code using no cyclic permutation matrix.

The transmitter according to the disclosure has an effect of preventing an increase in power consumption and a deterioration in error correction capability.

The configuration set forth in the above embodiment shows an example of the subject matter, and it is possible to combine the configuration with another technique that is publicly known, and is also possible to make omissions and changes to part of the configuration without departing from the gist.

What is claimed is:

1. A transmitter comprising:
 encoding circuitry configured to generate a code word by performing coding with a low-density parity-check code using a check matrix, the encoding circuitry being capable of receiving a code rate control signal and switching the check matrix for use in generating the code word based on the received code rate control signal, between a first check matrix with a first code rate and a second check matrix with a second code rate smaller than the first code rate, the first check matrix containing a plurality of cyclic permutation matrices, the encoding circuitry generating the second check matrix by masking the cyclic permutation matrix at a predetermined position in the first check matrix and adding a row with a column weight equal to or less than a threshold; and
 transmission circuitry to transmit the code word.

2. The transmitter according to claim 1, wherein each of weights of some columns in the first check matrix is equal to a weight of a corresponding column in the second check matrix.

3. A receiver comprising:
 demodulation circuitry to receive a signal transmitted by the transmitter according to claim 2, and demodulate the received signal; and
 decoding circuitry to decode a low-density parity-check code by using the demodulated signal.

4. The receiver according to claim 3, wherein the decoding circuitry includes:
 variable node calculation circuitry to perform calculation in a column direction of the check matrix;

check node calculation circuitry to perform calculation in a row direction of the check matrix;

first switching circuitry to switch a connection relationship between a column calculated by the variable node calculation circuitry and a row calculated by the check node calculation circuitry such that the switched connection relationship becomes a connection relationship of the check matrix corresponding to the first code rate and the second code rate; and second switching circuitry to switch a connection relationship between a row calculated by the check node calculation circuitry and a column calculated by the variable node calculation circuitry such that the switched connection relationship becomes the connection relationship of the check matrix corresponding to the first code rate and the second code rate.

5. A receiver comprising:

demodulation circuitry to receive a signal transmitted by the transmitter according to claim 1, and demodulate the received signal; and decoding circuitry to decode a low-density parity-check code by using the demodulated signal.

6. The receiver according to claim 5, wherein the decoding circuitry includes:

variable node calculation circuitry to perform calculation in a column direction of the check matrix;

check node calculation circuitry to perform calculation in a row direction of the check matrix;

first switching circuitry to switch a connection relationship between a column calculated by the variable node calculation circuitry and a row calculated by the check node calculation circuitry such that the switched connection relationship becomes a connection relationship of the check matrix corresponding to the first code rate and the second code rate; and second switching circuitry to switch a connection relationship between a row calculated by the check node calculation circuitry and a column calculated by the variable node calculation circuitry such that the switched connection relationship becomes the connection relationship of the check matrix corresponding to the first code rate and the second code rate.

7. A communication system comprising:

the transmitter according to claim 1; and a receiver comprising:

demodulation circuitry to receive a signal transmitted by the transmitter according to claim 1, and demodulate the received signal; and decoding circuitry to decode a low-density parity-check code by using the demodulated signal.

8. A method for changing a code rate to be used in a transmitter and a receiver, the transmitter transmitting a signal encoded with a low-density parity-check code, the receiver receiving the signal, the method comprising:

receiving a code rate control signal;

generating a code word by performing coding with a low-density parity-check code using a check matrix, the check matrix for use in generating the code word being switchable based on the received code rate control signal between a first check matrix with a first code rate and a second check matrix with a second code rate smaller than the first code rate, the first check matrix containing a plurality of cyclic permutation matrices;

generating the second check matrix by masking the cyclic permutation matrix at a predetermined position in the first check matrix and adding a row with a column weight equal to or less than a threshold;

transmitting the code word;

receiving the signal and demodulating the received signal; and decoding the low-density parity-check code by using the demodulated signal.

9. The method for changing a code rate, according to claim 8, wherein each of weights of some columns in the first check matrix is equal to a weight of a corresponding column in the second check matrix.

10. A control circuit for controlling a transmitter to generate a code word by performing coding with a low-density parity-check code using a check matrix, and transmit the code word, the control circuit enabling the transmitter to switch the check matrix for use in generating the code word based on a received code rate control signal, between a first check matrix with a first code rate and a second check matrix with a second code rate smaller than the first code rate, the first check matrix containing a plurality of cyclic permutation matrices, the control circuit causing the transmitter to perform a process of generating the second check matrix by masking the cyclic permutation matrix at a predetermined position in the first check matrix and adding a row with a column weight equal to or less than a threshold.

11. A non-transitory storage medium to store a program for controlling a transmitter to generate a code word by performing coding with a low-density parity-check code using a check matrix, and transmit the code word, the program being executed by a processor to: enable the transmitter to switch the check matrix for use in generating the code word based on a received code rate control signal, between a first check matrix with a first code rate and a second check matrix with a second code rate smaller than the first code rate, the first check matrix containing a plurality of cyclic permutation matrices; and cause the transmitter to perform a process of generating the second check matrix by masking the cyclic permutation matrix at a predetermined position in the first check matrix and adding a row with a column weight equal to or less than a threshold.

* * * * *